United States Patent [19]

Dixit et al.

[11] Patent Number: 5,510,294
[45] Date of Patent: Apr. 23, 1996

[54] METHOD OF FORMING VIAS FOR MULTILEVEL METALLIZATION

[75] Inventors: Girsh A. Dixit; Fusen E. Chen; Alexander Kalnitsky, all of Dallas, Tex.

[73] Assignee: SGS-Thomson Microelectronics, Inc., Carrollton, Tex.

[21] Appl. No.: 453,563

[22] Filed: May 26, 1995

Related U.S. Application Data

[60] Continuation of Ser. No. 275,819, Jul. 15, 1994, abandoned, which is a division of Ser. No. 815,704, Dec. 31, 1991, abandoned.

[51] Int. Cl.⁶ .......................... H01L 21/44; H01L 21/467
[52] U.S. Cl. .......................... 437/195; 437/228; 437/962; 148/DIG. 105; 148/DIG. 106
[58] Field of Search ...................... 437/190, 195, 437/228, 246, 962; 148/DIG. 105, DIG. 106

[56] References Cited

U.S. PATENT DOCUMENTS

| | | | |
|---|---|---|---|
| 4,484,978 | 11/1984 | Keyser . | |
| 4,745,089 | 5/1988 | Osban | 148/DIG. 106 |
| 4,902,377 | 2/1990 | Berglund et al. | 437/195 |
| 4,977,105 | 12/1990 | Okamoto et al. | 437/190 |
| 5,112,763 | 5/1992 | Taylor et al. | 148/DIG. 105 |

FOREIGN PATENT DOCUMENTS

| | | | |
|---|---|---|---|
| 62-85444 | 4/1987 | Japan . | |
| 62-132347 | 6/1987 | Japan | 148/DIG. 105 |
| 63-78552 | 4/1988 | Japan | 148/DIG. 105 |
| 1-15935 | 1/1989 | Japan . | |
| 1-36022 | 2/1989 | Japan | 148/DIG. 105 |
| 2-122653 | 5/1990 | Japan . | |
| 3-259529 | 11/1991 | Japan . | |

OTHER PUBLICATIONS

Translation of JP 62-132347 (Nase).

van den Hoek, et al., J. Vac. Sci. Technol., A7 (3) May/Jun. 1983 pp. 670–675.

S. Wolf, Silicon Processing for the VLSI Era II, Lattice Press, Sunset Beach, CA, 1990.

*Primary Examiner*—Brian Hearn
*Assistant Examiner*—Leon Radomsky
*Attorney, Agent, or Firm*—Lisa K. Jorgenson; Kenneth C. Hill; Richard K. Robinson

[57] ABSTRACT

A method is provided for forming a via for multilevel metallization of an integrated circuit, and an integrated circuit formed according to the same. A first conductive layer is formed over the integrated circuit. A first dielectric layer is then, formed over the first conductive layer. A second dielectric layer over the first dielectric layer and a second conductive layer is formed over the second dielectric layer. A photoresist layer is formed and patterned over the second conductive layer to expose a portion of the second conductive layer. The second conductive layer is etched to form an opening exposing a portion of the second dielectric layer. The second dielectric layer is then etched in the opening to form partially sloped sidewalls sloping outward at an upper surface of the dielectric layer. The photoresist layer is removed. The remaining second dielectric layer and the first electric layer is then anisotropically etched in the opening exposing the portion of the first conductive layer in the opening. The second conductive layer is then removed. A third conductive layer is deposited over the second dielectric layer and in the opening.

17 Claims, 1 Drawing Sheet

METHOD OF FORMING VIAS FOR MULTILEVEL METALLIZATION

This is a continuation of application Ser. No. 08/275,819, filed Jul. 15, 1994, abandoned, which is a Divsion of application Ser. No. 07/815,704, filed Dec. 31, 1991, abandoned.

FIELD OF THE INVENTION

The present invention relates generally to semiconductor integrated circuit processing, and more specifically to forming vias for multilevel metallization.

BACKGROUND OF THE INVENTION

In semiconductor circuits, interconnect layers or multilevel metallization is necessary for the proper operation of the various devices fabricated. Interconnect signal lines make contact with lower conductive layers in the integrated circuit through vias in an insulating layer. For best operation of the devices, the lower conductive layer cannot be damaged during formation of the contact vias.

Various interlevel insulating layers are deposited on the integrated circuit during formation of the devices. These layers separate the conductive layers from each other. One method to form contact vias through these insulating layers utilizes a photoresist layer to define the via locations. An anisotropic etch is then performed to open the vias. Due to the increased topography of submicron devices, the thicknesses of the interlevel insulating layers are significantly different in various regions of the die. The differences in thicknesses requires prolonged etching of the insulating layers to insure good electrical contact in all of the vias. During the prolonged anisotropic etch, however, the etch chemistry causes a chemical reaction to take place between the photoresist, the interlevel insulating layers and the lower conductive layer. Typically, during the etch process, polymers are created which adhere to the sidewalls of the via.

As known in the prior art, the polymers are removed or dissolved through the use of a solvent, acid or plasma etch. Due to the submicron dimensions of the vias and the restriction on use of caustic chemicals, the removal of these polymers poses a formidable task. Retaining any of the polymer build up causes difficulties in achieving high standards of reliability of the devices. Removal of all of the polymeric material, however, may result in a substantial amount of the underlying conductive layer to be removed. Additionally, the acid or plasma etch can remove some of the insulating layer, which enlarges the size of the via.

Therefore, it would be desirable to provide a technique for forming contact vias in integrated circuits which prevents the formation of such polymeric films.

SUMMARY OF THE INVENTION

The invention may be incorporated into a method for forming a semiconductor device structure, and the semiconductor device structure formed thereby, by forming an opening in a dielectric layer exposing a portion of an underlying first conductive layer wherein the dielectric has partially sloped sidewalls sloping outward at an upper surface of the dielectric layer. A second conductive layer is then formed over the dielectric layer and in the opening.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
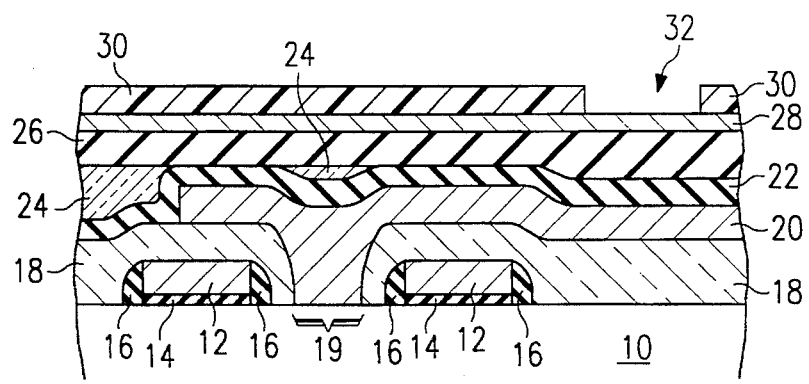
FIGS. 1–4 are cross-sectional views of the fabrication of a semiconductor device structure according to the present invention.

Referring to FIG. 1, an integrated circuit device is to be formed on a silicon substrate 10. Transistor gate electrodes 12 are formed over the substrate 10 as is well known in the art. Gate electrodes 12 are formed over a gate oxide layer 14. Sidewall oxide spacers 16 are formed along the sidewalls of the gate electrodes 12 and gate oxide 14. A planarizing dielectric layer 18 is formed over the integrated circuit, preferably borophosphorous silicate glass (BPSG).

A first opening 19 is made through the planarizing layer 18 to expose a portion of the underlying substrate 10. A first conductive layer 20 is formed over the planarizing layer 18 and in the opening 19. Layer 20 is typically patterned and etched to form an interconnect contacting an underlying active region at the bottom of opening 19. The first conductive layer 20 typically has a thickness of between approximately 3000 to 15,000 angstroms. Layer 20 is preferably a refractory metal such as titanium, titanium nitride or an aluminum/silicon/copper alloy or any suitable refractory metal used in the art. A conformal first interlevel dielectric layer 22, such as plasma oxide, is formed over the first conductive layer 20 and the planarizing dielectric layer 18. Layer 22 will typically have a thickness of between approximately 3000 to 5000 angstroms.

Planarization of the integrated circuit is important for future device fabrication. A planarizing layer 24, such as a spin-on-glass, may formed over the first dielectric layer 22 and etched back to form a planarized layer. Deposition and patterning of the various layers may be varied to be made consistent with process flows for the devices being fabricated. Device fabrication up to this stage utilizes conventional process steps well known in the art.

A second dielectric layer 26, such as oxide, is formed over the first dielectric layer 22. Layer 26 typically has a thickness of between 5000 to 7000 angstroms. The depth of layers 22 and 26 must be sufficient enough that when etching these layers in subsequent steps, a via of the proper shape is formed.

A second conductive layer 28 is deposited over the dielectric layer 26. Layer 28 will typically have a thickness of between approximately 300 to 1000 angstroms. Layer 28 is again preferably a refractory metal such as titanium, titanium nitride or an aluminum/silicon/copper alloy or any suitable metal used in the art. A photoresist layer 30 is formed over conductive layer 28. Photoresist layer 30 is patterned to form an opening 32.

Figure 2:
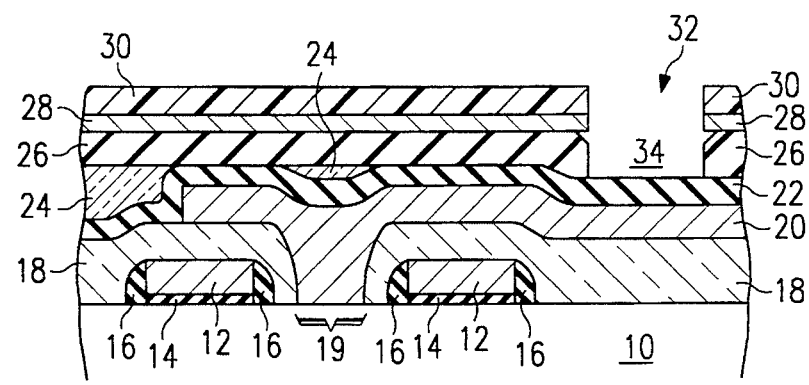

Referring to FIG. 2, the second conductive layer 28 is selectively etched using the dielectric layer 26 as an etch stop. Dielectric layer 26 is then isotropically etched to form partially sloped sidewalls at an upper portion of the sidewalls. The isotropic etch may be a wet or dry etch which forms an opening or via 34 in layer 26. The etch process is a timed etch and therefore only part of layer 26 may be etched away in via 34. Alternatively, all of layer 26 in via 34 may be etched away and part of layer 22 may also be etched away in via 34, depending upon the length of time of the etch.

Figure 3:
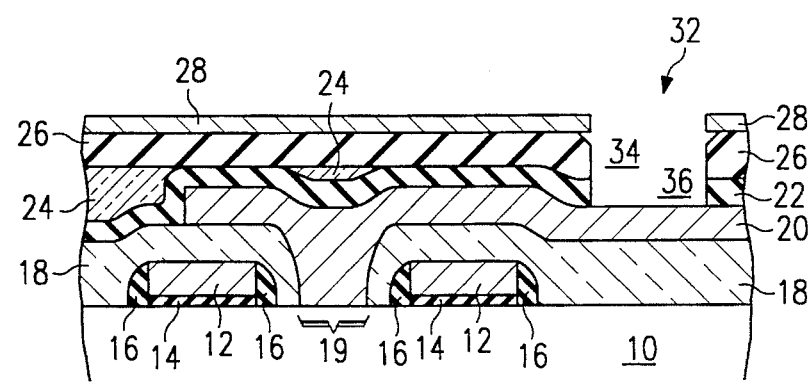

Referring to FIG. 3, photoresist layer 30 is removed. The first dielectric layer 22 and any remaining portion of layer 26 is then anisotropically etched to form an opening or via 36 exposing the first conductive layer 20 in the opening. The anisotropic etch is typically a dry etch process. With the photoresist removed, there can be no chemical reaction between the photoresist, the oxide layers and tile underlying metal layer during the etching process of the oxide layers. No complex chemical compounds, such as polymers, will build up along the sidewalls of the oxide layers 22, 26. There is no need to remove any such compounds, thus simplifying the process.

Figure 4:
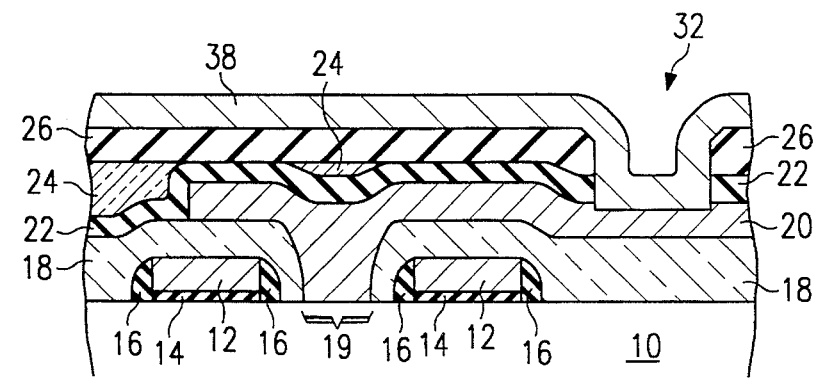

Referring to FIG. 4, the second conductive layer 28 is then etched away. During this etch, a portion of the first conductive layer 20 may also be etched away. A third conductive layer 38 is then deposited over the second dielectric layer 26 and in the opening 32 to contact to the lower first conductive layer 20. Layer 38 typically has a thickness of between approximately 8000 to 20,000 angstroms and is preferably a refractory metal or an alloy such as those identified above. If layer 28 is not removed, it becomes an integral part of the upper conductive layer 38. However, there may be step coverage problems under layer 28 where the sidewalls of oxide layer 26 slope outward from the via.

One advantage of the present invention, is that in forming layer 28 before the via is etched in the oxide layers, an opening can first be etched through layer 28 using the underlying oxide layer 26 as an etch stop. Once the photoresist layer 30 is removed, the etch chemistry cannot cause a chemical reaction between the composition of the photoresist chemicals and the underlying oxide and metal layers. Etching the via exposing the underlying metal layer 20 can be performed without the inherent problem of such a chemical reaction resulting in unwanted chemical compounds which then have to be removed.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A method of forming a via for multilevel metallization for a semiconductor integrated circuit, comprising the steps of:

forming an opening in a dielectric layer exposing a portion of an underlying first conductive layer wherein the dielectric has partially sloped sidewalls sloping outward at an upper surface of the dielectric layer, wherein the step of forming the opening in the dielectric layer further includes the steps of:

forming a third conductive layer over the dielectric layer and before the second conductive layer is formed;

forming and patterning a photoresist layer over the third conductive layer;

isotropically etching partway through the dielectric layer;

removing the entire photoresist layer;

after the entire photoresist layer has been removed, anisotropically etching the remaining dielectric layer in the opening exposing the first conductive layer in the opening;

after exposing the first conductive layer in the opening, removing the third conductive layer before the second conductive layer is formed; and forming a second conductive layer over the dielectric layer and in the opening.

2. The method of claim 1, wherein the first conductive layer has a thickness of between approximately 3000 to 15,000 angstroms.

3. The method of claim 1, wherein the second conductive layer has a thickness of between approximately 8000 to 20,000 angstroms.

4. The method of claim 1, wherein the dielectric layer comprises an oxide.

5. The method of claim 1, wherein the dielectric layer has a thickness of between approximately 8000 to 13,000 angstroms.

6. The method of claim 1, wherein the third conductive layer has a thickness of between approximately 300 to 1000 angstroms.

7. The method of claim 1, wherein the first, second and third conductive layers comprise a refractory metal.

8. The method of claim 1, wherein the isotropic etch is a wet etch.

9. The method of claim 1, wherein the isotropic etch is a dry etch.

10. The method of claim 1, wherein the anisotropic etch is a dry etch.

11. A method of forming a via for multilevel metallization for a semiconductor integrated circuit, comprising the steps of:

forming a first conductive layer over the integrated circuit;

forming a first dielectric layer over the first conductive layer;

forming a second dielectric layer over the first dielectric layer;

forming a second conductive layer over the second dielectric layer;

forming and patterning a photoresist layer over the second conductive layer to expose a portion of the second conductive layer;

etching the second conductive layer to form an opening exposing a portion of the second dielectric layer;

partially isotropically etching the second dielectric layer in the opening to form a partially sloped sidewall sloping outward at an upper surface of the dielectric layer;

entirely removing the photoresist layer after the isotropic etching step;

after the entire photoresist layer has been removed, anisotropically etching the remaining second dielectric layer and the first dielectric layer in the opening exposing the portion of the first conductive layer in the opening;

removing the second conductive layer; and forming a third conductive layer over the second dielectric layer and in the opening.

12. The method of claim 11, wherein the first conductive layer comprises a refractory metal having a thickness of between approximately 3000 to 15,000 angstroms.

13. The method of claim 11, wherein the first dielectric layer comprises an oxide having a thickness of between approximately 3000 to 5000 angstroms.

14. The method of claim 11, wherein the second dielectric layer comprises an oxide having a thickness of between approximately 5000 to 7000 angstroms.

15. The method of claim 11, wherein the second conductive layer comprises a refractory metal having a thickness of between approximately 300 to 1000 angstroms.

16. The method of claim 11, wherein the third conductive layer comprises a refractory metal having a thickness of between approximately 8000 to 20,000 angstroms.

17. The method of claim 13, further comprising the step of partially etching the first dielectric layer during the partially isotropically etching the second dielectric layer step.

\* \* \* \* \*

UNITED STATES PATENT AND TRADEMARK OFFICE
CERTIFICATE OF CORRECTION

PATENT NO. : 5,510,294
DATED : April 23, 1996
INVENTOR(S) : Alexander Kalnitsky; Girish A. Dixit; Fusen E. Chen It is certified that error appears in the above-indentified patent and that said Letters Patent is hereby corrected as shown below:

On the title page, Item [75], Inventors: Alexander Kalnitsky; Girish A. Dixit; Fusen E. Chen.

Signed and Sealed this

Sixteenth Day of July, 1996

Attest:

*Bruce Lehman*

BRUCE LEHMAN

*Attesting Officer*     *Commissioner of Patents and Trademarks*